United States Patent [19]
Aoki et al.

[11] Patent Number: 5,737,474
[45] Date of Patent: Apr. 7, 1998

[54] SEMICONDUCTOR OPTICAL DEVICE

[75] Inventors: Masahiro Aoki; Makoto Takahashi; Hiroshi Sato, all of Kokubunji, Japan

[73] Assignee: Hitachi, Ltd., Tokyo, Japan

[21] Appl. No.: 542,840

[22] Filed: Oct. 13, 1995

[30] Foreign Application Priority Data

Oct. 13, 1994 [JP] Japan .................. 6-247511

[51] Int. Cl.⁶ ............................................. G02B 6/10
[52] U.S. Cl. ................................. 385/131; 385/132
[58] Field of Search ............................ 257/94, 96, 98; 372/45, 46, 50; 385/108, 129–132

[56] References Cited

U.S. PATENT DOCUMENTS

| | | | |
|---|---|---|---|
| Re. 31,806 | 1/1985 | Scifres et al. | 372/50 |
| 5,555,544 | 9/1996 | Walpole et al. | 372/50 |

OTHER PUBLICATIONS

The Autumn Conference of the Institute of Electronics, Information and Communication Engineers of Japan, C–303, Sep., 1994 Optics Letters, vol. 16, No. 5, pp. 306–308 (1991).

*Primary Examiner*—John Ngo
*Attorney, Agent, or Firm*—Antonelli, Terry, Stout, & Kraus, LLP

[57] ABSTRACT

A semiconductor optical device is provided which includes a semiconductor substrate, a first core layer disposed on the substrate with a second core layer being interposed between the substrate and the first core layer. The second core layer has a lower refractive index than that of the first core layer. A ridge-shaped optical waveguide region is formed in a top surface of the first core layer. The width of the ridge-shaped optical waveguide is modulated along a direction which coincides with an optical axis of the semiconductor optical device. Further, the width of a bottom surface of the ridge-shaped optical waveguide is selected not to be greater than 4 μm over a whole length thereof.

20 Claims, 9 Drawing Sheets

FIG.1A
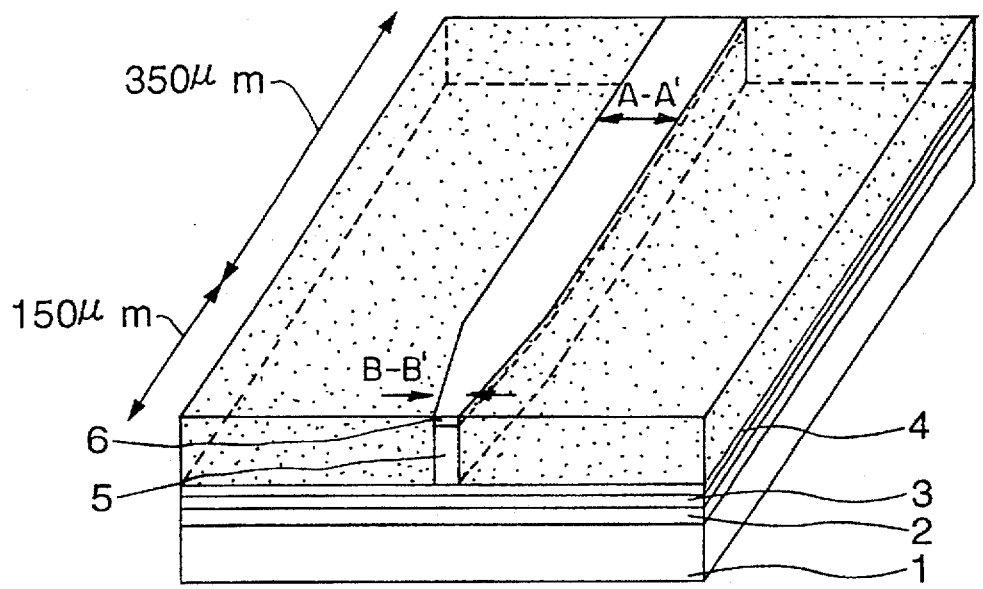
FIG.1B
FIG.1C
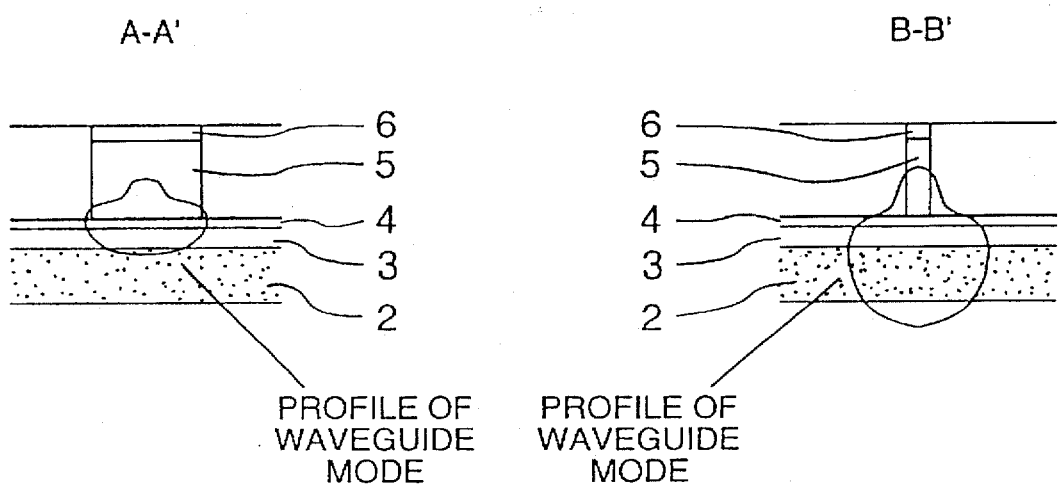

A-A'

PROFILE OF
WAVEGUIDE
MODE

B-B'

PROFILE OF
WAVEGUIDE
MODE

PROFILE OF
WAVEGUIDE
MODE

PROFILE OF
WAVEGUIDE
MODE

SEMICONDUCTOR OPTICAL DEVICE

BACKGROUND OF THE INVENTION

The present invention generally relates to a semiconductor optical device and, more particularly, to such a semiconductor optical device which can find profitable and advantageous applications to optical communication systems, optical networks and others.

In general, an input (incident)/output (emitted) beam of a semiconductor optical device such as a semiconductor laser, optical amplifier, optical modulator and the like has a spot size which is as small as on the order of about ⅓ to ⅕ of the beam diameter in the optical fiber. Under the circumstances, coupling of a laser beam to an optical fiber is generally realized by using an expensive optical lens system in an effort to prevent the optical coupling efficiency from degrading due to mismatch in the beam diameter between the semiconductor optical device and the optical fiber. However, in view of the prospect that many semiconductor optical devices having simple structures will be able to be manufactured at lower costs in the not-too-distant future, there will certainly arise a demand for the capability of mounting the semiconductor optical devices more conveniently and inexpensively without resorting to the expensive conventional optical lens systems. As one of the measures for satisfying such demand, there can be mentioned a method of enlarging the diameter of the laser beam emitted or outputted from the semiconductor laser. In this conjunction, an approach has been proposed and reported that a layer thickness and/or a waveguide width of the laser active layer is controlled or modulated in the direction along the optical axis of the laser device for thereby enlarging or expanding the diameter of the emitted or outputted beam. Certainly, such waveguide width control of the active layer can easily be realized by employing a conventional lithography process. By contrast, the control or modulation of the layer thickness requires in general a technique for controlling the growth of the active layer in a substrate surface by using, e.g. a selective growth process or the like. Consequently, the manufacturing process becomes extremely complicate. Additionally, it is noted that the characteristics of the laser device manufactured through the complicated process such as mentioned above are in actuality considerably inferior to those of the ordinary laser device. As an attempt for evading such complexity, a combination of a double core waveguide structure and waveguide width modulation has been studied, although it is still at a theoretical level. However, because the waveguide width is as large as on the order of 7 μm, the attempt mentioned above can not practically be applied to a semiconductor laser device, an optical modulator and the like which require indispensably a single transverse mode of operation at a low threshold value.

Parenthetically, the approaches and techniques for expanding the output beam diameter of the semiconductor laser device are reported in "The Autumn Conference of the Institute of Electronics, Information and Communication Engineers of Japan, C-303, September, 1994", while the technique concerning the combination of the double core waveguide structure and the waveguide width control (modulation) is reported in "Optics Letters", Vol. 16, No. 5, pp. 306–308, (1991).

SUMMARY OF THE INVENTION

In the light of the state of the art briefed above, it is an object of the present invention to provide a novel and improved structure of an output beam-expanded semiconductor laser device which can be implemented by an extremely simple manufacturing method and which can ensure a high output power as well as excellent temperature characteristics at a lower threshold value.

Another object of the present invention is to provide a method of manufacturing the same.

A further object of the present invention is to provide a semiconductor optical device structure which can profitably and advantageously be applied to a semiconductor laser, an optical amplifier, an optical modulator, an optical switch, a photodetector of indiumphosphor series or an integrated optical waveguide device constituted by integrating at least two of these devices.

In view of the above and other objects which will become more apparent as the description proceeds, there is provided according to a general aspect of the present invention a semiconductor optical device of a structure which can be implemented very easily by combining a double core waveguide structure and modulation or control of a width of a ridge-shaped waveguide and which can ensure expansion of the input/output beam without incurring deterioration in the characteristics of the optical waveguide device such as the semiconductor laser.

According to another aspect of the present invention, there is provided a technique for further enhancing the characteristics mentioned above by adopting a ridge structure of a reversed mesa shape and a superlattice waveguide.

In the first place, description will be made of an aspect of the invention directed to an output beam expanded semiconductor laser structure which can be implemented by adopting a combination of a double core waveguide structure and a waveguide width modulation (control) as well as a method capable of easily manufacturing the same without deteriorating the characteristics thereof.

Referring to FIG. 1A of the accompanying drawings, there are formed on an n-type InP substrate 1, an auxiliary waveguide layer 2 of n-type InGaAsP (having a compositional wavelength of 1.10 μm) in a thickness of 1.0 μm, a spacer layer 3 of n-type InP in a thickness of 0.3 μm, an active layer 4 of InGaAsP (having a compositional wavelength of 1.3 μm) in a thickness of 0.1 μm, a cladding layer 5 of p-type InP in a thickness of 2.0 μm and a cap layer 6 of p-type InGaAs in a thickness of 0.2 μm sequentially in this order through conventional processes. Subsequently, a laser structure including a ridge-shaped optical waveguide having a vertical mesa structure (see FIG. 1A) is formed through a wet etching process by using an aqueous solution of hydrochloric acid or a mixed aqueous solution of hydrochloric acid and phosphoric acid and a conventional laser manufacturing process. At this juncture, it is important to note that the bottom surface of the ridge-shaped waveguide has a width of 2.5 μm and is tapered or constricted to 0.5 μm in width at the laser beam output or emission end. Thus, for the operation with a wavelength of 1.3 μm, the laser structure constitutes a single transverse mode waveguide. The length of the tapered region in which the ridge width is gradually changed is 150 μm, whereas the whole length of the ridge-shaped waveguide is 500 μm. Incidentally, FIG. 1B shows partially a cross section taken along a line A–A' in FIG. 1A, and FIG. 1C is a sectional view taken along a line B–B' in FIG. 1A.

It has experimentally been established that the laser device as fabricated in the structure described above exhibits improved characteristics at a room temperature and under continuous oscillation condition such that the threshold value is in a range of 8 to 10 mA and that the oscillation efficiency is 0.40 W/A. Besides, even during operation at a high-temperature of 85° C., there characteristics can be obtained to those of the conventional laser device such that the threshold value falls within a range of 18 to 22 mA and that the oscillation efficiency is 0.30 W/A. These advantageous features of the laser device fabricated according to the teachings of the invention can be explained by the fact that the laser characteristics scarcely undergo deterioration due to introduction of the beam expanding function because the basic structure of the laser and the manufacturing processes therefor are substantially the same as those adopted in the conventional laser devices known heretofore. On the other hand, the spot size of the output laser beam emitted from the front end face having the ridge width of 0.5 μm can be expanded to 7.5 μm which is about three times as large as the beam spot size of about 2.5 μm at the rear end face having a ridge width of 2.5 μm. This effect can be explained by the fact that owing to the ridge-shaped waveguide structure taught by the present invention, the action for confining the light in the ridge-shaped waveguide region progressively becomes feeble as the ridge width gradually decreases, whereby distribution of the light intensity expands from the active layer located immediately below the ridge-shaped waveguide region toward the underlying auxiliary waveguide layer. In that case, the scattering of light rays can sufficiently be suppressed by selecting the length of the tapered region to be on the order of 150 μm. Incidentally, coupling of the laser device of the structure described above with a single-mode optical fiber having a core diameter of 10 μm has shown that a coupling loss of less than 2 dB can be realized with the positioning accuracy of ±3 μm in the horizontal and vertical directions.

According to another important aspect of the invention, it is taught to implement the ridge-shaped waveguide in a reversed mesa structure. FIGS. 2A to 2C are views showing schematically an output beam expanded laser device incorporating a ridge-shaped waveguide region of a reversed mesa structure formed by a wet etching process with an aqueous solution of hydrobromic acid or a mixed aqueous solution of hydrobromic acid and a phosphoric acid. In the case of this beam expanded laser device, resistivity of the ridge-shaped waveguide region can be decreased by a factor of ⅓ to ½ when compared with the vertical mesa structure shown in FIG. 1A, as a result of which not only the threshold current can correspondingly be lowered but also high-temperature characteristics can be improved. Besides, because the optical confinement within the ridge-shaped waveguide region of the reversed mesa structure is more effective when compared with that of the vertical mesa structure shown in FIG. 1A, the quantity of the laser light confined within the active layer decreases more steeply than in the case of the vertical mesa structure (FIG. 1A) for a given decrease of the ridge width, whereby the conversion efficiency of the beam spot size can effectively be improved. This in turn means that the ridge width modulated or controlled region (i.e., the tapered region) required for realizing the desired conversion ratio can be made shorter by implementing the ridge-shaped waveguide in the reversed mesa structure, whereby scattering loss and radiation loss which the light travelling the waveguide undergoes can be suppressed more effectively and positively. Thus, further enhancement and improvement of the laser characteristics can be expected.

In general, it is very difficult to allow a mixed polycrystal such as InGaAsP to grow stably in a layer throughout a thickness greater than 1 μm. A further aspect of the invention is directed to this problem. FIGS. 3A to 3C show another structure of the semiconductor optical device in which the auxiliary waveguide layer 2 of n-type InGaAsP having a compositional wavelength of 1.10 μm and in a thickness of 1.0 μm is realized in a superlattice structure 7 constituted by n-type InGaAsP layers (having a compositional wavelength of 1.0 μm) of 0.05 μm in thickness and n-type InP layers of 0.05 μm in thickness with a periodicity of twenty stacks. Using to this structure, there can easily be realized an auxiliary optical waveguide layer of superlattice structure having a stable compositional distribution and a preferably low refractive index.

As can be seen from the foregoing, there are provided according to the teachings of the present invention optical structures for the output beam expanded laser device which can easily be implemented by combinations of the double core waveguide structure and the waveguide width modulation or control elucidated above as well as methods of manufacturing the same without incurring any appreciable deterioration in the aimed characteristics. Further, it can readily be understood from the foregoing description that the characteristics of the beam-expanded laser device can further be improved by incorporating the ridge-shaped waveguide of the reversed mesa structure and/or the auxiliary optical waveguide superlattice structure.

By the way, it is known that degraded operation of a short wavelength laser, such as one designed for a wavelength of about 1 μm or less in a high output power state, is ascribable to crystal deterioration in an end face where the optical density distribution is high. In this conjunction, it is to important to note that according to the teachings of the invention, the beam spot size can easily be expanded or enlarged. This, in turn, means that the optical density at the emission or output end face can significantly be lowered. Thus, the crystal in the emission end face can be protected against deterioration, whereby the use life of the semiconductor laser device can remarkably be lengthened, to another great advantage.

It goes without saying that essentially the same advantageous actions and effects as those described above can be obtained equally in the cases where the teachings of the present invention are applied to an optical amplifier, optical modulator, an optical switch, a photodetector or an integrated optical waveguide device implemented by integrating at least two devices selected from those mentioned above.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIG. 1A is an isometric view showing schematically a semiconductor optical device manufactured according to one aspect of the present invention;

FIG. 1B is a fragmentary schematic sectional view of the same taken along a line A–A' in FIG. 1A;

FIG. 1C is a fragmentary schematic sectional view of the same taken along a line B–B' in FIG. 1A;

DESCRIPTION OF THE PREFERRED EMBODIMENTS

Now, the present invention will be described in detail in conjunction with what are presently considered as preferred or typical embodiments thereof by reference to FIGS. 4 to 9. In the following description, it is to be understood that such terms as "left", "right", "top", "bottom", "upwardly", "downwardly", "vertical", "horizontal" and the like are words of convenience and are not to be construed as limiting terms.

Embodiment 1

Figure 2A:
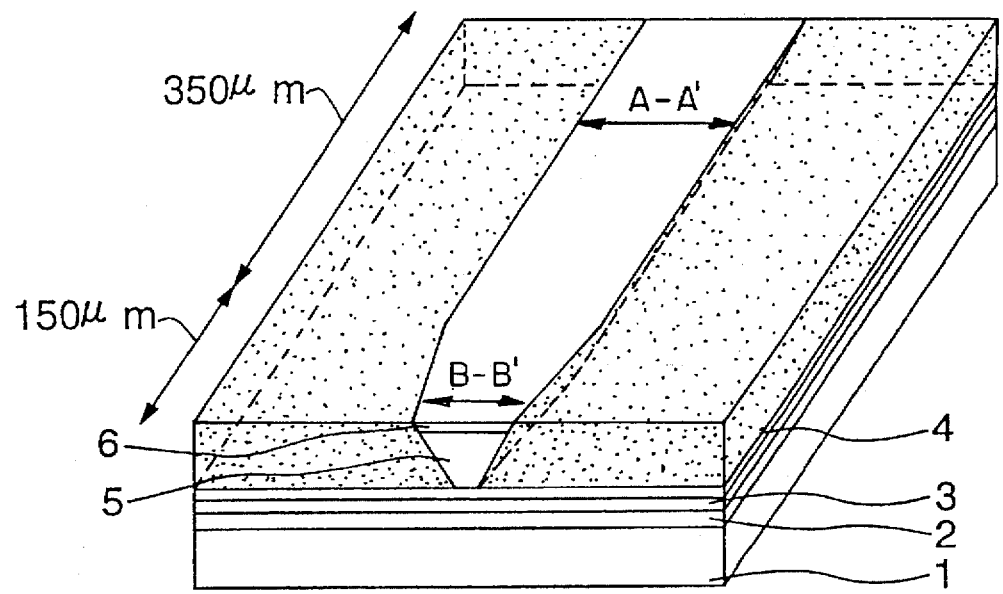
FIG. 2A is an isometric view showing schematically a semiconductor optical device manufactured according to another aspect of the present invention.
Figure 2B:
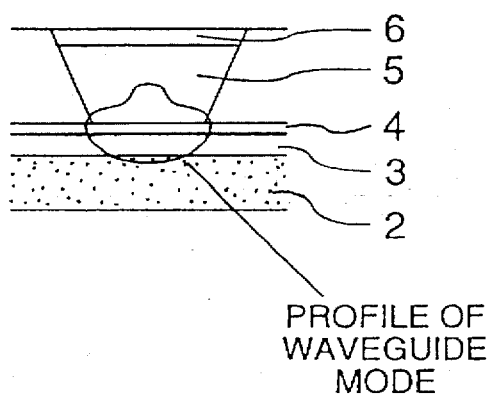
FIG. 2B is a fragmentary schematic sectional view of the same taken along a line A–A' in FIG. 2A.
Figure 2C:
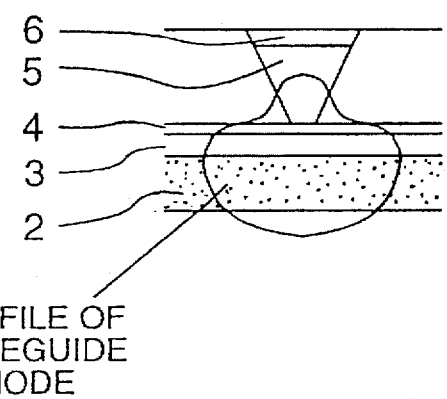
FIG. 2C is a fragmentary schematic sectional view of the same taken along a line B–B' in FIG. 2A.
Figure 3A:
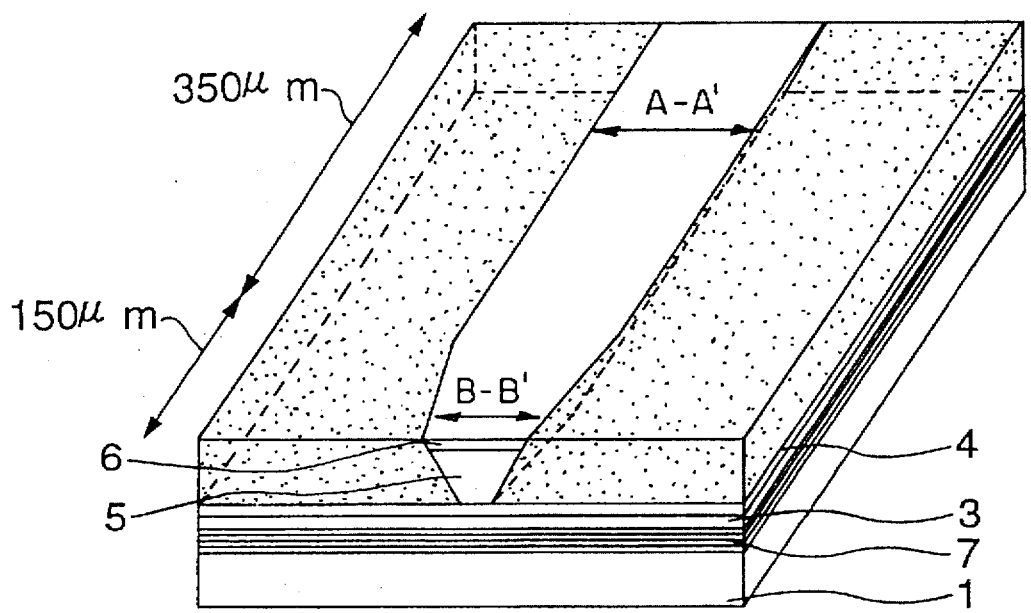
FIG. 3A is an isometric view showing schematically a semiconductor optical device manufactured according to yet another aspect of the present invention.
Figure 3B:
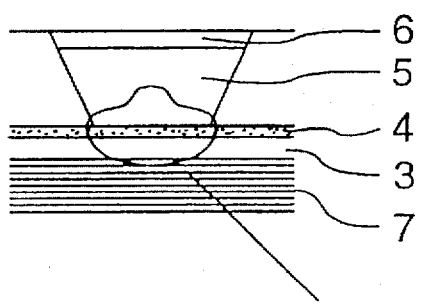
FIG. 3B is a fragmentary schematic sectional view of the same taken along a line A–A' in FIG. 3A.
Figure 3C:
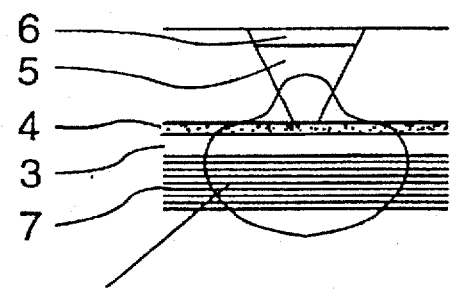
FIG. 3C is a fragmentary schematic sectional view of the same taken along a line B–B' in FIG. 3A.
Figure 4A:
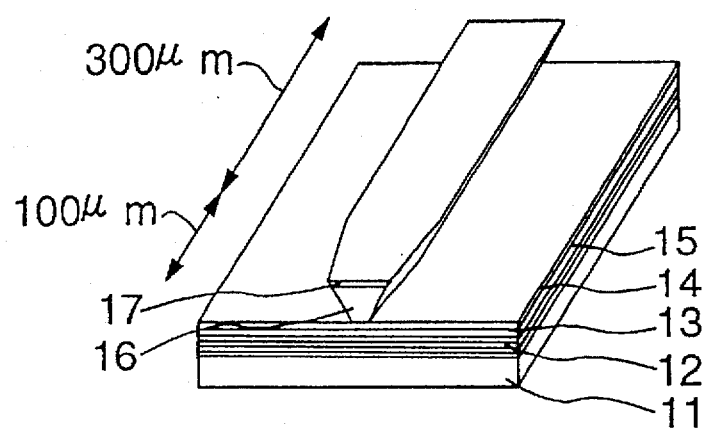
FIG. 4A is an isometric view showing schematically a semiconductor optical device according to a first embodiment of the invention during a manufacturing step.
Figure 4B:
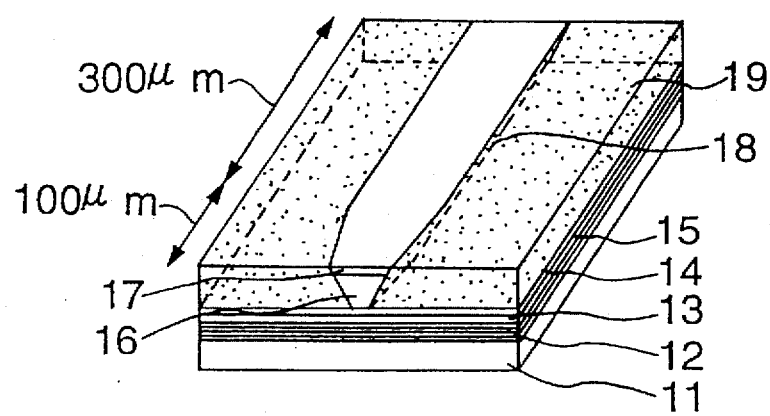
FIG. 4B is a view similar to FIG. 4A and shows the same during another manufacturing step.
Figure 4C:
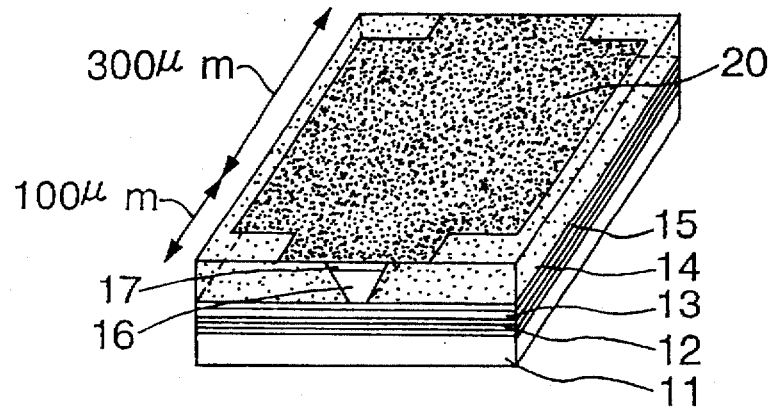
FIG. 4C is a similar view showing the same in a finished state.

FIGS. 4A to 4C are views for illustrating a semiconductor optical device according to a first embodiment of the invention. Referring to these figures, there are formed a semiconductor substrate 11 of n-type (100) InP, an auxiliary optical waveguide layer 12 of a superlattice structure constituted by n-type InGaAsP layers (whose compositional wavelength is 1.10 μm) each of 0.05 μm in thickness and n-type InP layers each of 0.05 μm in thickness with a periodicity of ten combinations, an n-type InP spacer layer 13 of 0.5 μm in thickness, a multiple quantum-well active layer 14 constituted by InGaAsP layers (whose compositional wavelength is 1.37 μm) each having a thickness of 6.0 nm and serving as a well layer and InGaAsP layers (whose compositional wavelength is 1.10 μm) each having a thickness of 8 nm and serving as a barrier layer with a periodicity of seven combinations, an upper optical guide layer 15 of InGaAsP having a compositional wavelength of 1.10 μm and a thickness of 0.05 μm, a p-type InP cladding layer 16 of 1.7 μm in thickness and a p-type InGaAs cap layer 17 which is about 0.2 μm thick which are deposited sequentially on the substrate 11 in order the above listed. The various layers mentioned above may be formed by resorting to conventional techniques or processes known heretofore.

Subsequently, through a conventional process, the cap layer 17 is etched for forming thereby a stripe structure having a width of 4.9 μm and extending in the direction [011], wherein a tapered stripe region is so formed as to have a width of 2.9 μm at a laser beam emission or output end face. The length of the tapered stripe region is 100 μm. In succession, a ridge-shaped waveguide region having a cross-section of a reversed mesa structure whose side walls are defined by (111) A planes, respectively, is formed through a wet etching process by using a mixed aqueous solution of hydrobromic acid and phosphoric acid. Refer to FIG. 4A. As a result of this, the width of a bottom surface of the ridge-shaped waveguide region which represents the width of the active layer is 2.5 μm while it is 0.5 μm at a tip end of the tapered region.

Next, a silicon oxide film 18 is deposited in a thickness of 0.15 μm over the whole surface of the substrate through a conventional process, which is then followed by formation of a polyamide resin film 19 over the whole surface of the substrate. Thereafter, a silicon oxide film window is formed on a top surface of the ridge, and after formation of an electrode 20, a device having a cavity length of 400 μm inclusive of the tapered region of the length of 100 μm is cut out through a cleavage process. Finally, a reflection film having a high reflectivity of 90% is deposited on a rear end face of the ridge-shaped waveguide region which has a width of 2.5 μm, also by resorting to a conventional process.

It has experimentally been established that the semiconductor optical device fabricated in the structure described above exhibits improved oscillation characteristics at a room temperature under continuous oscillation conditions such that the threshold value falls within a range of 8 to 12 mA and that the oscillation efficiency is 0.45 to 0.51 W/A. Furthermore, even in a high-temperature operation at 85° C., there can be obtained such preferred characteristics that the threshold value is in a range of 16 to 22 mA and that oscillation efficiency is about 0.30 to 0.34 W/A. Besides, the spot size of the output laser beam from a front end face having the ridge width of 0.5 μm is expanded to 7.5 μm, which means that expansion of the beam diameter about three times as large as the beam spot size of about 2.5 μm at the rear end face of the ridge having the width of 2.5 μm can be achieved. Coupling of the semiconductor optical device of the structure described above with a single-mode fiber having a core diameter of 10 μm without using any optical lens has shown that a coupling loss less than 2 dB can be realized with the positioning accuracy of ±3 μm in the horizontal and vertical directions. Further, evaluation of the long-term reliability of the semiconductor optical device according to the instant embodiment of the invention performed at a high temperature of 90° C. has shown that the use life of the device as estimated is 100,000 hours at the shortest.

Embodiment 2

Figure 5A:
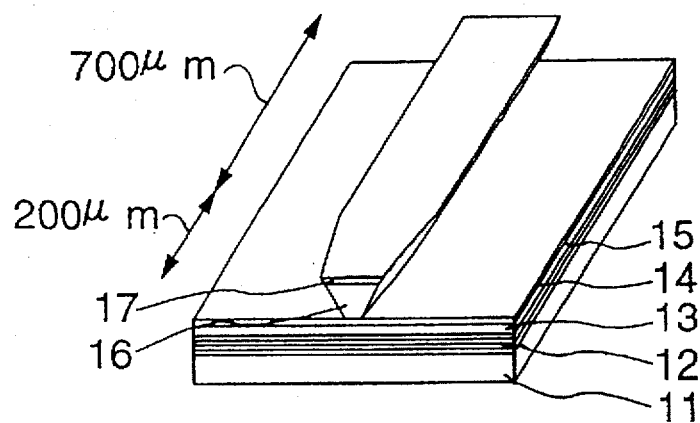
FIG. 5A is an isometric view showing schematically a semiconductor optical device according to a second embodiment of the invention during a manufacturing step.
Figure 5B:
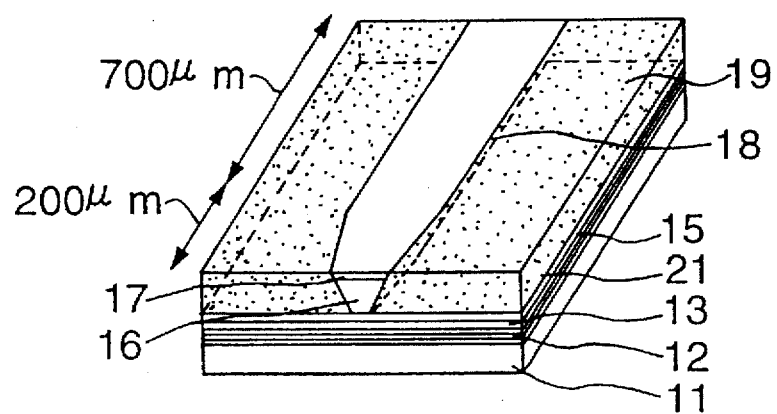
FIG. 5B is a view similar to FIG. 5A and shows the same during another manufacturing step.
Figure 5C:
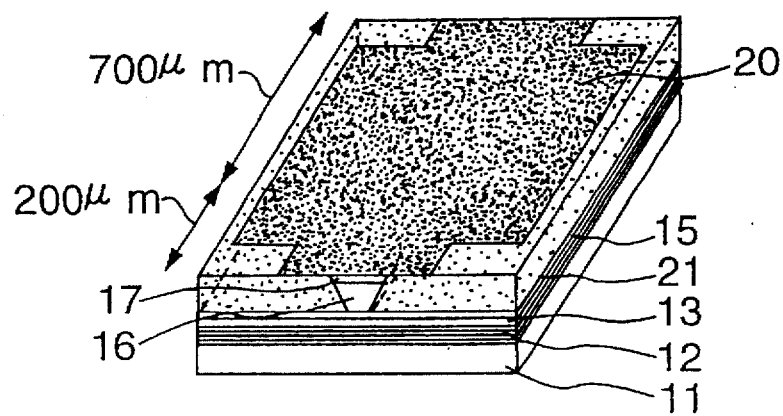
FIG. 5C is a similar view showing the same in a finished state.

FIGS. 5A to 5C show a semiconductor optical device according to a second embodiment of the present invention, which is directed to a high-power laser device capable of oscillating at a wavelength of 1.48 μm, which device can be fabricated through procedure or processes substantially similar to those described above in conjunction with the first embodiment. A distorted InGaAsP multiple quantum well structure 21 having an emission light wavelength of 1.48 μm is implemented as the active layer through a conventional process. With a view to realizing a stable high-power single transverse mode, the laser device according to the second embodiment of the invention is so implemented as to have a light emission region of 2.2 μm in width, a tapered region of 200 μm in length and a cavity length of 900 μm, wherein a low reflectivity film having a reflectivity of 3% and a high reflectivity film having reflectivity of 90% are formed on both end faces of the device. It has experimentally been established that the semiconductor laser device fabricated in the structure described above exhibits improved oscillation characteristics at a room temperature under the continuous oscillation condition such that the oscillation threshold value is about 25 to 32 mA and that the oscillation efficiency is 0.40 to 0.43 W/A. Further, a maximum output power of 300 mW can be obtained. On the other hand, the spot size of the output laser beam emitted from the front end face having the ridge width of 0.5 μm is 7.5 μm. By implementing this laser device in a module, there can be obtained a maximum module output power of 240 mW, reflecting a low loss of 1.0 dB in the coupling with the fiber. Furthermore, it has been found that by employing the device according to the instant embodiment of the invention as an excitation light source for an Erbium-doped fiber amplifier, excellent optical amplification characteristics of smaller noise figure can be realized.

Embodiment 3

Figure 6A:
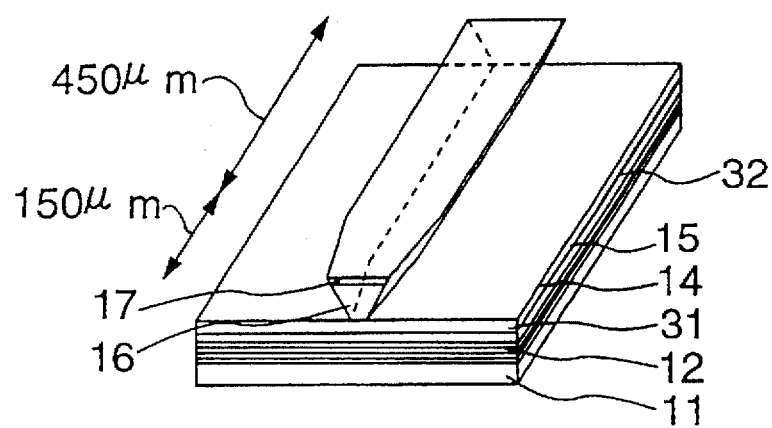
FIG. 6A is an isometric view showing schematically a semiconductor optical device according to a third embodiment of the invention during a manufacturing step.
Figure 6B:
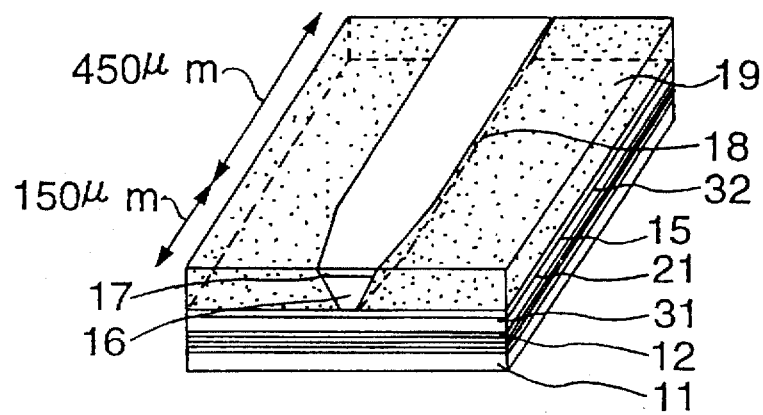
FIG. 6B is a view similar to FIG. 6A and shows the same during another manufacturing step.
Figure 6C:
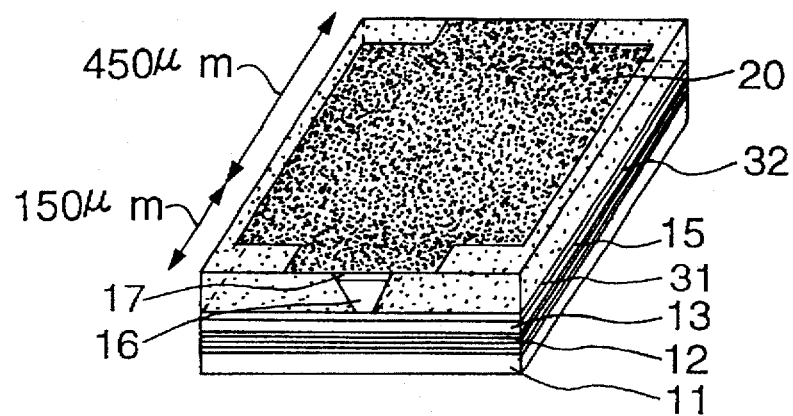
FIG. 6C is a similar view showing the same in a finished state.

FIGS. 6A to 6C show a semiconductor optical device according to a third embodiment of the present invention, which is implemented in the form of a high power distribution feed-back type laser device designed to oscillate at a wavelength of 1.55 μm, and which can be fabricated through procedure or processes substantially similar to those described above in conjunction with the first embodiment. A distorted InGaAsP multiple quantum well structure 21 having an emission light wavelength of 1.55 μm and a λ/4 phase shift diffraction grating 32 having a period of 241 nm are implemented in the active layer by a conventional process. With a view to realizing a high output power and a stable single transverse mode, the laser device according to the instant embodiment of the invention is so implemented as to have a light emission region having a width of 2.2 μm, a tapered region having a length of 150 μm and a cavity length of 600 μm, wherein a low reflectivity film having a reflectivity of 1% and a high reflectivity film having a reflectivity of 90% are formed on both end faces of the device, respectively. It has experimentally been established that the semiconductor laser device fabricated in the structure described above exhibits improved oscillation characteristics at a room temperature under the continuous oscillation condition such that the oscillation threshold value is 15 to 18 mA and that the oscillation efficiency is 0.35 to 0.40 W/A. Further, a maximum output power of 150 mW can be obtained. On the other hand, the spot size of the output laser beam emitted from the front end face having the ridge width of 0.5 μm is 7.5 μm. By implementing this laser device in a module, there could be obtained a maximum module output power of 240 mW, reflecting a low coupling loss of 1.0 dB.

Embodiment 4

Figure 7A:
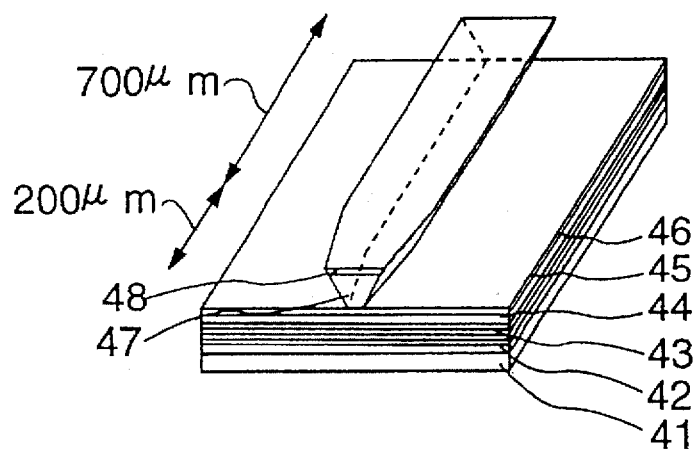
FIG. 7A is an isometric view showing schematically a semiconductor optical device according to a fourth embodiment of the invention during a manufacturing step.
Figure 7B:
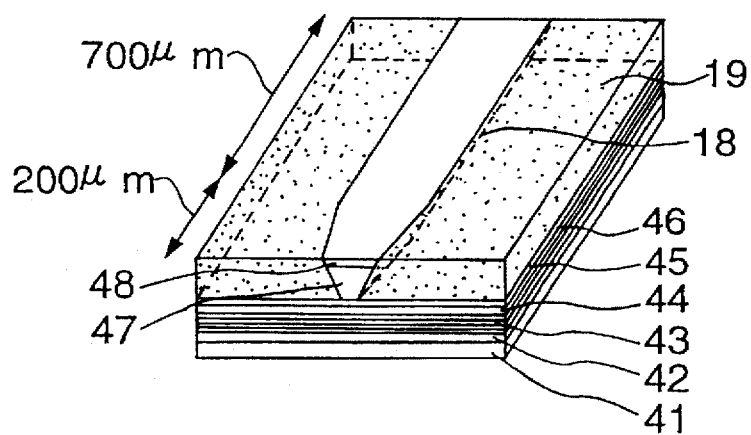
FIG. 7B is a view similar to FIG. 7A and shows the same during another manufacturing step.
Figure 7C:
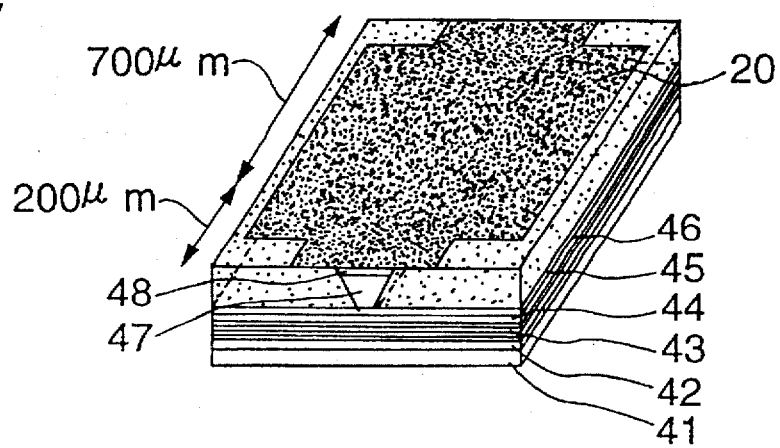
FIG. 7C is a similar view showing the same in a finished state.

FIGS. 7A to 7C show a semiconductor optical device according to a fourth embodiment of the present invention, which is directed to a semiconductor laser device. Referring to these figures, there are formed on an n-type (100) GaAs semiconductor substrate 11, a buffer layer 42 of n-type $In_{0.51}Ga_{0.49}P$ in a thickness of 2.0 μm, an auxiliary waveguide layer 43 of a super lattice structure constituted by n-type GaAs layers each of 0.01 μm in thickness and n-type $In_{0.51}Ga_{0.49}P$ layers each of 0.09 μm in thickness with a periodicity of ten stacks, an n-type $In_{0.51}Ga_{0.49}P$ spacer layer 44 of 0.5 μm in thickness, a single quantum well active layer 45 constituted by an $In_{0.17}Ga_{0.83}As$ layer of 6.0 nm in thickness which serves as a well layer and an InGaAsP having a compositional wavelength of 0.70 μm and a thickness of 8 nm and serves as a barrier layer, an upper optical guide layer 46 of InGaAsP having a compositional wavelength of 0.70 μm and a thickness of 0.05 μm, a p-type $In_{0.51}Ga_{0.49}P$ cladding layer 47 of 1.7 μm in thickness and a p-type GaAs cap layer 48 of 0.2 μm thick, wherein the various layers mentioned above are deposited sequentially on the substrate 11 in this order by resorting to conventional techniques or processes.

Subsequently, through a conventional process, the cap layer 48 is etched for forming thereby a stripe structure having a width of 4.6 μm and extending in the direction [011] through a conventional process with a tapered stripe region being formed so as to present a width of 2.9 μm at a laser beam emission or output end face. The length of the tapered stripe region is 200 μm. In succession, a ridge waveguide having a cross-section of a reversed mesa shape having side walls defined by (111) A planes is formed through a wet etching process by using a mixed aqueous solution of hydrochloric acid and phosphoric acid, as can be seen in FIG. 7A. As a result of this, the width of a bottom surface of the ridge-shaped region which represents the width of the active layer is 2.2 μm while it is 0.5 μm at a tip end of the tapered region.

Next, a silicon oxide film 18 having a thickness of 0.15 μm is deposited over the whole surface of the substrate by a conventional method, which is then followed by formation of a polyamide resin film 19 over the whole surface of the substrate. Thereafter, a window of silicon oxide film is formed on a top surface of the ridge, and after formation of electrodes, a device having a cavity length of 900 μm inclusive of the tapered region having the length of 200 μm is cut through a cleavage process. Finally, a low reflection film having a reflectivity of 3% is formed on a front end face of the ridge having a width of 0.5 μm with a high reflection film having a reflectivity of 90% being formed on a rear end face of the ridge which has a width of 2.2 μm. Thus, there is realized a high output power semiconductor laser device which is designed to oscillate at a wavelength of 0.98 μm.

It has experimentally been established that the semiconductor laser device fabricated in the structure described above exhibits improved oscillation characteristics at a room temperature under the continuous oscillation condition such that the oscillation threshold value is 12 to 15 mA and that the oscillation efficiency is 0.60 to 0.70 W/A. Further, a maximum output power of 400 mW can be obtained. The spot size of the output laser beam emitted from the front end face having the ridge width of 0.5 μm is 7.0 μm. By implementing this laser device in a module, there can be obtained a maximum module output power of 300 mW, reflecting a low coupling loss of 1.2 dB involved in the coupling with the optical fiber. On the other hand, it is known that deterioration occurring in the high power operation of the laser of the wavelength band mentioned above is due to crystal deterioration at the emission end face having a high optical density distribution. In this conjunction, it should be mentioned that in the case of the laser device according to the instant embodiment of the invention, the crystal degradation at the emission end face can remarkably be suppressed even in the high power operation because the optical density at the emission end face can be reduced by virtue of easy capability of enlarging or expanding the beam spot size as mentioned previously.

Furthermore, it has been found that by using the semiconductor optical device according to the instant embodiment of the invention as an excitation light source for an Erbium-doped fiber amplifier, excellent optical amplification characteristics of small noise figure can be realized.

Parenthetically, it goes without saying that improvement or elongation of the use life of the laser device owing to lowering of the optical density at the emission end face by expanding the beam diameter can be assured for all the high power semiconductor laser device having wavelengths not longer than about 1 µm.

Embodiment 5

Figure 8A:
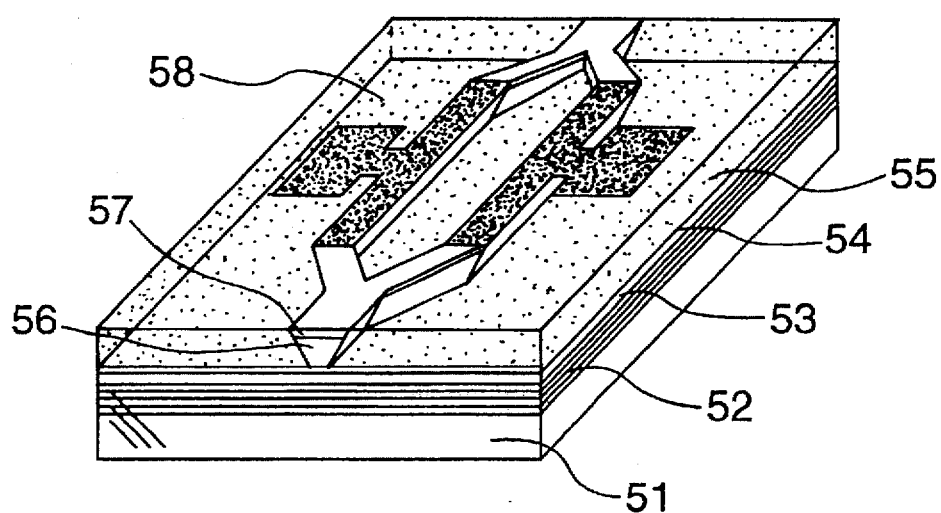
FIG. 8A is an isometric view showing schematically a semiconductor optical device according to a fifth embodiment of the invention.
Figure 8B:
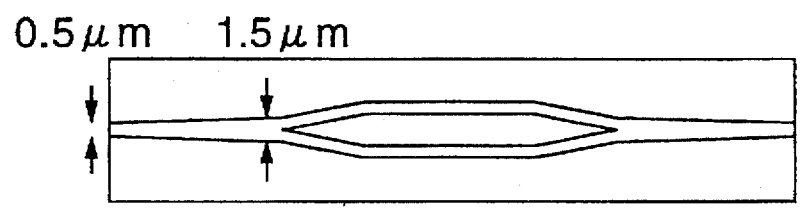
FIG. 8B is a schematic top plan view of the same.

FIGS. 8A and 8B show a semiconductor optical device according to a fifth embodiment of the present invention, which is directed to a Mach Zender type optical modulator. Referring to these figures, there are formed on an n-type (100) InP semiconductor substrate 51, an auxiliary optical waveguide layer 52 of a superlattice structure constituted by n-type InGaAsP layers (having compositional wavelength of 1.10 µm) each of 0.05 µm in thickness and n-type InP layers each of 0.05 µm in thickness with a periodicity of ten stacks, an n-type InP spacer layer 53 of 0.5 µm in thickness, a multiple quantum well structure (active layer) 54 constituted by InGaAsP layers (whose compositional wavelength is 1.50 µm) each having a thickness of 9.0 nm and serving as a well layer and InP layers each having a thickness of 6 nm and serving as a barrier layer, an upper optical guide layer 55 of InGaAsP having a compositional wavelength of 1.15 µm and a thickness of 0.05 µm, a p-type InP cladding layer 56 of 1.7 µm in thickness, and a p-type InGaAs cap layer 57 having a thickness of 0.21 µm. These various layers can be deposited sequentially in the order mentioned above by resorting to conventional growth techniques or processes. Subsequently, through a conventional process, the cap layer 57 is etched in such a manner as shown in FIGS. 8A and 8B. The waveguide extends in the direction [011]. In succession, a ridge-shaped waveguide having a cross-section of a reversed mesa shape whose side walls are defined by (111) A planes, respectively, is formed through a wet etching process by using a mixed aqueous solution of hydrobromic acid and phosphoric acid, as can be seen in FIG. 8A. The ridge-shaped waveguide region is so tapered that the width is decreased from 1.5 µm to 0.5 µm at the emission end face, as can be seen in FIG. 8B.

Subsequently, a silicon oxide film 57 having a thickness of 0.60 µm is deposited over the whole surface of the substrate through a conventional process, which is then followed by formation of a polyamide film 58 over the whole surface of the substrate. Thereafter, a window of silicon oxide film is formed on a top surface of the ridge by an etch-back process, as can be seen in FIGS. 8A and 8B. After formation of an electrode, a device having a length of 1.4 mm is cut out by a cleavage process. Finally, reflection films of a low reflectivity are formed on front and rear end faces of the device to thereby manufacture a Mach Zender type optical modulator.

It has experimentally been ascertained that the Mach Zender optical modulator type device manufactured as mentioned above exhibits preferable modulation characteristics. Furthermore, it has been found that the overall insertion loss is as low as 7 dB, reflecting excellent optical coupling characteristic with the optical fiber as well as the smooth configuration of the side walls of the ridge waveguide. Besides, a modulation band of 20 GHz can be realized, which reflects constriction or narrowing of the width of the ridge. Additionally, optical data transmission executed at a rate of 10 Gbits/second by using the optical modulator device according to the instant embodiment shows that excellent transmission can be achieved without being accompanied with any appreciable deterioration of signal quality.

Embodiment 6

Figure 9A:
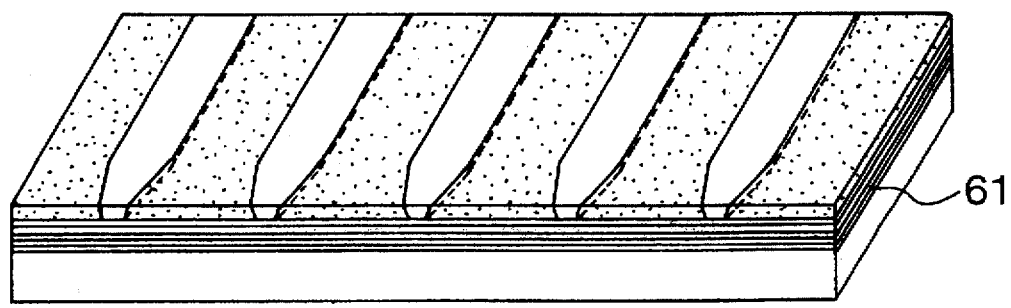
FIG. 9A is an isometric view showing schematically a semiconductor optical device according to a sixth embodiment of the invention during a manufacturing step.
Figure 9B:
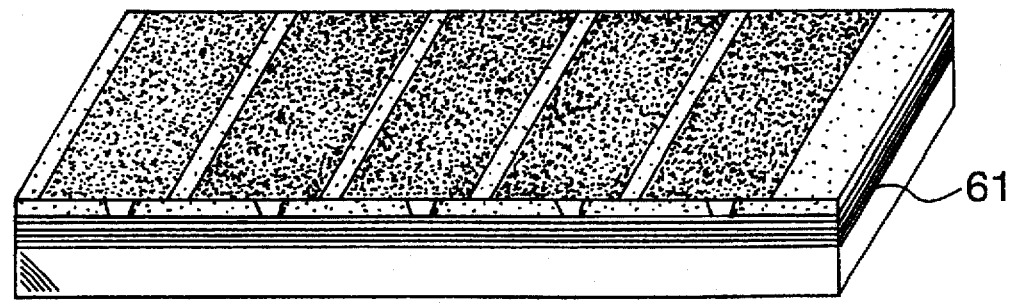
FIG. 9B is a similar view showing the same in a finished state.

FIGS. 9A and 9B show yet another structure of the semiconductor optical device according to a sixth embodiment of the present invention in which an array of lasers for ten channels is formed on one and the same substrate through procedures or processes substantially similar to those described hereinbefore in conjunction with the first embodiment. More specifically, a distorted InGaAsP multiple quantum well structure 61 having an emission light wavelength of 1.3 µm is implemented as the active layer by a conventional process. With a view to realizing a low threshold value, the laser device according to the instant embodiment is so implemented as to have a light emission region of 1.5 µm in width which is narrowed down to 0.3 µm at the emission end. The tapered region is 50 µm in length with the cavity length of 150 µm. High reflector films having reflectivities of 80% and 90% are formed on both end faces, respectively. It has experimentally been established that the semiconductor lasers of all the channels exhibit improved oscillation characteristics at a room temperature under the continuous oscillation condition such that the oscillation threshold value is 1.3 to 1.5 mA and that the oscillation efficiency is 0.45 to 0.47 W/A. The coupling efficiency with optical fiber as achieved is 3 dB with the positioning accuracy of ±3 µm. It has been confirmed that the semiconductor optical device according to the instant embodiment of the invention can be utilized as a light source for optical fibers interconnecting which are computer boards with excellent transmission characteristics improved significantly in respect to delays in light emission and transmission among others.

It is now apparent from the foregoing that according to the teachings of the present invention, the ridge-shaped or ridge-loaded type optical waveguide device can readily be realized which permits easy optical coupling with an optical fiber and which can operate at low voltage and current and nevertheless can assure high-speed operation characteristics. Besides, the device according to the invention can be manufactured at a surprisingly increased yield while assuring enhanced performance. Additionally, applications of the semiconductor optical devices according to the invention to optical communication systems will lead to implementation of such systems at low cost with increased processing capacity and extended range of communications.

Many features and advantages of the present invention are apparent form the detailed description, and, thus, it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

By way of example, a mixed aqueous solution of acetic acid with hydrobromic acid or hydrochloric acid may be employed, resulting in the same effects as mentioned previously.

Accordingly, all suitable modifications and equivalents may be resorted to, falling within the spirit and scope of the invention.

We claim:

1. A semiconductor optical device, comprising:
   a semiconductor substrate;
   a first core layer disposed on said substrate with a second core layer being interposed between said substrate and said first core layer, said second core layer having a lower refractive index than that of said first core layer; and
   a ridge-shaped optical waveguide region formed in a top surface of said first core layer;
   wherein width of said ridge-shaped optical waveguide region is changed along a direction coinciding with an optical axis of said semiconductor optical device and wherein width of a bottom surface of said ridge-shaped optical waveguide does not exceed 4 µm over a whole length thereof.

2. A semiconductor optical device according to claim 1, wherein said second core layer is implemented in a superlattice structure formed of materials differing from each other in respect to composition thereof.

3. A semiconductor optical device according to claim 1, wherein angles formed between a surface of said substrate and both side walls of said ridge-shaped optical waveguide region, respectively, are each smaller than 90° inclusive.

4. A semiconductor optical device according to claim 1, wherein each of side walls of said ridge-shaped optical waveguide region is defined by a (111) A crystal plane.

5. A semiconductor optical device according to claim 1, wherein said ridge-shaped optical waveguide region is formed by processing a cladding layer of InP forming a part the waveguide region by using one aqueous solution selected from a group which consists of an aqueous solution of hydrobromic acid, a mixed aqueous solution of hydrobromic acid and phosphoric acid and a mixed aqueous solution of hydrobromic acid and acetic acid.

6. A semiconductor optical device according to claim 1, wherein said ridge-shaped optical waveguide region is formed by processing a cladding layer of InP forming a part of the waveguide region by using one aqueous solution selected from a group which consists of an aqueous solution of hydrochloric acid, a mixed aqueous solution of hydrochloric acid and phosphoric acid, and a mixed aqueous solution of hydrochloric acid and acetic acid.

7. A semiconductor optical device according to claim 1, wherein said ridge-shaped optical waveguide region is formed by processing a cladding layer of AlGaAs forming a part of the waveguide region by using an aqueous solution of hydrofluoric acid.

8. A semiconductor optical device according to claim 1, wherein said ridge-shaped optical waveguide region is formed by processing a cladding layer of $In_{0.51}Ga_{0.49}P$ forming a part of the waveguide region by using one aqueous solution selected from a group which consists of an aqueous solution of hydrochloric acid, a mixed aqueous solution of hydrochloric acid and phosphoric acid, and a mixed aqueous solution of hydrochloric acid and acetic acid.

9. A semiconductor optical device according to claim 1, wherein said ridge-shaped optical waveguide region is formed by processing a cladding layer of InGaAlP forming a part of waveguide region by using an aqueous solution of hydrofluoric acid.

10. A semiconductor optical device according to claim 9, wherein said second core layer is implemented in a superlattice structure formed of a combination of materials selected from a group which consists of combinations of InAsP and InP, InGaAsP and InP, InAlAs and InP, InGaAlAs and InP, GaAs and InGaP, GaAs and InAsP, GaAs and InGaAsP, and GaAs and AlGaAs.

11. A semiconductor optical device according to claim 1, wherein width of said ridge-shaped optical waveguide region is narrowed at a light emission end thereof when compared with the width of the remaining portion of said ridge-shaped optical waveguide region.

12. A semiconductor optical device according to claim 1, wherein said ridge-shaped optical waveguide region includes at least two electrodes for application of a current or a voltage; and
   wherein said electrodes are formed on a surface of said semiconductor optical device at a side where said ridge-shaped optical waveguide is formed.

13. A semiconductor optical device comprising:
   an optical active region and at least an output region for an incident light, wherein said output region for the incident light comprises:
   a first core layer and a second core layer, said second core layer having a lower refractive index than that of said first core layer; and
   a ridge-shaped optical waveguide region formed on said first core layer,
   wherein width of said ridge-shaped optical waveguide region is changed along a direction coinciding with an optical axis of said semiconductor optical device.

14. A semiconductor optical device comprising:
   an optical active region and at least an output region for an incident light, wherein said output region for the incident light comprises:
   a first core layer and a second core layer, said second core layer having a lower refractive index than that of said first core layer, wherein said second core layer comprises a superlattice structure; and
   a ridge-shaped optical waveguide region formed on said first core layer,
   wherein width of said ridge-shaped optical waveguide region is changed along a direction coinciding with an optical axis of said semiconductor optical device.

15. A semiconductor optical device comprising:
   an optical active region and at least an output region for an incident light, wherein said output region for the incident light comprises:
   a first core layer and a second core layer, said second core layer having a lower refractive index than that of said first core layer; and
   a ridge-shaped optical waveguide region formed on said first core layer,
   wherein width of said ridge-shaped optical waveguide region is changed along a direction coinciding with an optical axis of said semiconductor optical device, and wherein width of a bottom surface of said ridge-shaped optical waveguide is smaller than width of a top surface of said ridge-shaped optical waveguide.

16. A semiconductor optical device according to claim 1, 13, 14 or 15, wherein said semiconductor optical device is a semiconductor laser device.

17. A semiconductor optical device according to claim 1, 13, 14 or 15, wherein said semiconductor optical device is an optical amplifier.

18. A semiconductor optical device according to claim 1, 13, 14 or 15, wherein said semiconductor optical device is an optical modulator.

19. A semiconductor optical device according to claim 1, 13, 14 or 15, wherein said semiconductor optical device is an optical switch.

20. A semiconductor optical device according to claim 1, 13, 14 or 15, wherein said semiconductor optical device is a photodetector.

* * * * *